(12) United States Patent
Patel et al.

(10) Patent No.: US 6,970,029 B2
(45) Date of Patent: Nov. 29, 2005

(54) VARIABLE-DELAY SIGNAL GENERATORS AND METHODS OF OPERATION THEREFOR

(75) Inventors: Bheem Patel, Sunnyvale, CA (US); Ming Zeng, Arcadia, CA (US); Tsung-Chuan Whang, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/751,135

(22) Filed: Dec. 30, 2003

(65) Prior Publication Data

US 2005/0140417 A1 Jun. 30, 2005

(51) Int. Cl.[7] .............................................. H03H 11/26
(52) U.S. Cl. ..................... 327/261; 327/272; 327/276; 327/288
(58) Field of Search ................................. 327/261, 264, 327/269–272, 276–278, 281, 284, 285, 288, 327/293–299, 392–400, 161

(56) References Cited

U.S. PATENT DOCUMENTS

| | | | |
|---|---|---|---|
| 5,148,381 A | | 9/1992 | Sprague ...................... 364/723 |
| 5,489,864 A | * | 2/1996 | Ashuri ........................ 327/161 |
| 5,572,158 A | | 11/1996 | Lee et al. |
| 5,608,343 A | | 3/1997 | Ojima et al. |
| 5,641,931 A | | 6/1997 | Ogai et al. .................... 84/661 |
| 5,754,062 A | | 5/1998 | Satoh et al. |
| 6,073,151 A | | 6/2000 | Baker et al. ................ 708/290 |
| 6,121,808 A | | 9/2000 | Gaudet ........................ 327/231 |
| RE37,452 E | | 11/2001 | Donnelly et al. |
| 6,348,826 B1 | | 2/2002 | Mooney et al. ............. 327/270 |
| 6,424,585 B1 | * | 7/2002 | Ooishi ......................... 365/226 |
| 6,445,229 B1 | * | 9/2002 | Schenck et al. ............ 327/116 |

(Continued)

OTHER PUBLICATIONS

Donnelly, K. S., et al., "A 660MB/s Interface Megacell Portable Circuit in -.3 $\mu$m-0.7 $\mu$m CMOS ASIC", *IEEE Journal of Solid-State Circuits, vol. 32*, (Dec. 1996), 1995-2003.

(Continued)

*Primary Examiner*—Kenneth B. Wells
*Assistant Examiner*—Hai L. Nguyen
(74) *Attorney, Agent, or Firm*—Schwegman, Lundberg, Woessner & Kluth, P.A.

(57) ABSTRACT

A variable-delay signal generator circuit includes a delay chain and an interpolator circuit. The delay chain produces multiple multi-phase signals, where each of the multi-phase signals represents a delayed version of an input event signal. Each of the multi-phase signals is separated from consecutive signals by a first phase increment. The interpolator circuit includes multiple interpolator blocks, where each block receives a multi-phase signal. The interpolator circuit interpolates between consecutive interpolator blocks, to produce an output signal that represents a modified-delay version of the input event signal. The output signal is delayed to one of multiple phase delays that exist between consecutive multi-phase signals, inclusive. To produce the output signal, a variable current source within each interpolator block is adjusted, based on a current source select signal. The current source select signal is produced by a bias circuit, which includes a split current source.

27 Claims, 8 Drawing Sheets

U.S. PATENT DOCUMENTS

| | | | | |
|---|---|---|---|---|
| 6,583,655 B2 * | 6/2003 | Takahashi et al. | ........... | 327/160 |
| 6,614,319 B2 * | 9/2003 | Saeki et al. | .................... | 331/17 |
| 6,621,317 B2 * | 9/2003 | Saeki | .......................... | 327/163 |
| 6,642,760 B1 * | 11/2003 | Alon et al. | ................. | 327/158 |
| 6,642,800 B2 * | 11/2003 | Drapkin et al. | ............... | 331/16 |
| 6,703,902 B2 * | 3/2004 | Jeon et al. | .................... | 331/17 |
| 6,748,549 B1 * | 6/2004 | Chao et al. | ................. | 713/401 |
| 6,759,881 B2 | 7/2004 | Kizer et al. | | |
| 6,774,686 B2 * | 8/2004 | Kennedy et al. | ............ | 327/156 |
| 6,794,912 B2 * | 9/2004 | Hirata et al. | ................ | 327/158 |
| 6,822,488 B1 * | 11/2004 | Riley | ......................... | 327/107 |

OTHER PUBLICATIONS

Haycock, Matthew, et al., "A 2.5Gb/s Bidirectional Signaling Technology", *Hot Interconnects Symposium V*, (Aug. 1997),pp. 1-8.

Lee, Thomas H., et al., "A 2.5 V CMOS Delay-Locked Loop for an 18 Mbit, 500 Megabyte/s DRAM", *IEEE Journal of Solid-State Circuits, vol. 29*, (Dec. 1994), 1491-1496.

Sidiropoulos, Stefanos, et al., "A Semidigital Dual Delay-Locked Loop", *IEEE Journal of Solid-State Circuits, vol. 32*, (Nov. 1997), 1683-1692.

* cited by examiner

VARIABLE-DELAY SIGNAL GENERATORS AND METHODS OF OPERATION THEREFOR

TECHNICAL FIELD

Embodiments of the inventive subject matter relate generally to integrated circuits. More particularly, embodiments of the inventive subject matter relate to a variable-delay circuit, which incorporates a delay line and an interpolator circuit, and to methods of using the same to produce a delayed signal.

BACKGROUND

Integrated circuits (ICs) typically contain one or more functional logic blocks (FLBs). ICs are often tested before they are incorporated into an electronic assembly, in order to verify that each component of each FLB on the IC functions properly, and to verify that the input/output (I/O) terminals of each IC operate correctly within specified timing parameters or timing margins.

In testing ICs, it is known to use source synchronous data transfer on busses interconnecting FLBs within a single IC or within an electronic assembly comprising multiple ICs. In a source synchronous interface, a receiving I/O buffer captures data based upon a strobe clock, or "timing marker," which is provided by another FLB or a device that is driving the data. The use of digital delay circuits on ICs to assist in centering a strobe signal with respect to a data cell is known in the art.

In order to test whether source synchronous interfaces are operating properly, it is desirable to be able to vary the delay of a digital delay circuit in order to shift a strobe signal across a full data bit cell time. This is desirable in order to measure the effective input latch setup and hold timing. Generally, the strobe signal is shifted by sequentially applying an ever increasing delay to the strobe signal. The phase increment between the delay steps has a granularity that is determined by the delay circuitry.

As device frequencies continue to increase, it is desirable to reduce the granularity between delay steps. Some prior art systems have used BiCMOS (bipolar, complementary metal oxide semiconductor) technologies to achieve relatively small delay step granularities. However, these systems have often included numerous ICs, and accordingly, such systems are expensive and tend to consume large amounts of power.

For the reasons stated above and for other reasons, which will become apparent upon reading and understanding the present specification, there is a significant need in the art for variable-delay circuits and methods of their use, which can produce delayed signals with reduced phase increments between delay steps. In addition, there is a need for variable-delay circuits and methods of their use, which maintain acceptable linearity between successive delay steps. Further needed are variable-delay circuits, which have relatively low IC counts, and which consume relatively small amounts of power.

BRIEF DESCRIPTION OF THE DRAWINGS

The appended claims point out, with particularity, different embodiments of the inventive subject matter described herein. However, the detailed description presents a more complete understanding of various embodiments of the inventive subject matter when considered in connection with the figures, wherein like-reference numbers refer to similar items throughout the figures and:

DETAILED DESCRIPTION

Various embodiments of the inventive subject matter described herein provide methods and apparatus for interpolating between phases of a periodic signal within an electronic system. Embodiments of the inventive subject matter may be referred to, individually and/or collectively, herein by the term "invention" merely for convenience and without intending to voluntarily limit the scope of this application to any single invention or inventive concept if more than one is in fact disclosed.

Embodiments of the invention include variable-delay signal generators and methods for their use. Examples of various electronic systems in which embodiments of the invention can be incorporated include, but are not limited to, test beds, computers (e.g., desktop, laptop, hand-held, server, etc.), wired or wireless communication devices (e.g., landline telephones, cellular phones, cordless phones, pagers, etc.), computer-related peripherals and devices (e.g., printers, scanners, monitors, network interfaces, cable modems, wired or wireless local area network devices, etc.), entertainment devices (e.g., televisions, radios, stereos, electronic games and game systems, tape and compact disk players, video cassette recorders, MP3 (Motion Picture Experts Group, Audio Layer 3) players, etc.), process control systems, aerospace equipment, automotive equipment, and the like.

Figure 1:
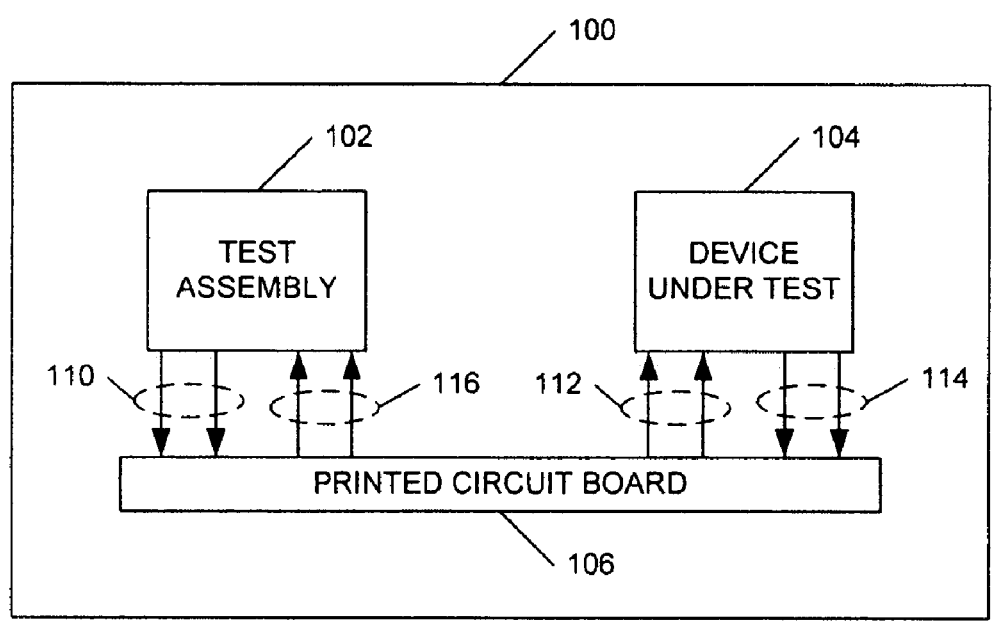
FIG. 1 illustrates a block diagram of a testing system, in accordance with an embodiment of the invention.

FIG. 1 illustrates a block diagram of a testing system 100, in accordance with an embodiment of the invention. System 100 includes a test assembly 102 and a device under test 104 (DUT), which exchange signals through a printed circuit board 106 (PCB). Various other intermediate PCBs, sockets, connectors, circuitry, and/or other electronic equipment can exist between test assembly 102 and DUT 104. However, these items are not illustrated for purposes of ease of illustration and description.

Test assembly 102 includes one or more integrated circuits (ICs), which can include, for example, one or more application specific ICs (ASICs), processors, and/or other devices. In one embodiment, test assembly 102 is incorporated into a single ASIC, although test assembly 102 can be incorporated into multiple ICs in other embodiments.

Test assembly 102 can be used, for example, to verify that one or more components on DUT 104 function properly, and/or to verify that the I/O terminals of DUT 104 operate correctly within specified timing parameters or timing margins. In one embodiment, test assembly 102 is used to determine when (i.e., at what time) an event occurs within DUT 104. In order to make this determination, test assembly 102 sends out one or more signals, referred to herein as "timing strobes" or "timing signals," over signal lines 110. Generally, a timing signal is a waveform, which can include a single pulse or multiple pulses. One timing signal can be sent over a single signal line 110, or multiple timing signals can be sent over multiple signal lines 110, in parallel or sequentially.

DUT 104 receives the timing signals over signal lines 112. DUT 104 then performs one or more appropriate functions, in response to the timing signals, and sends return strobes or data back to test assembly 102 over signal lines 114, 116. For example, DUT 104 can provide, over signal lines 114, 116, one or more CMOS (complementary metal oxide semiconductor) voltage signals having values between 0 and 1. Other types of signals can be provided, as well.

Test assembly 102 monitors signal lines 114, in order to determine when an event occurs. In one embodiment, test assembly 102 drives out multiple timing signals over multiple output signal lines 110, and it receives multiple signals over multiple input signal lines 116. By sending the timing signals on signal lines 110 and monitoring signal lines 116, test assembly 102 can test the speed, timing, and/or functionality of DUT 104.

The timing signals produced by test assembly 102 are delayed versions of "event signals" produced internally by the test assembly 102. The delay value applied to each internal event signal is variable within a range of at least one full data bit cell time, in one embodiment.

In one embodiment, the timing signals are delayed using a variable-delay, signal generator circuit, which includes a delay chain and an interpolator circuit. The delay chain receives an input signal (e.g., an event signal), and it produces multiple, multi-phase signals, which represent delayed versions of the input signal. Consecutive multi-phase signals are separated by first phase increments having a first granularity. The interpolator circuit receives the multi-phase signals from the delay chain, and it interpolates between selected consecutive signals, to produce an interpolated signal as an output. The interpolated signal represents a delayed and interpolated version of the input signal, wherein the interpolated version is delayed to one of multiple, intermediate delay values that are separated by a second phase increment that is smaller than the first phase increment. Accordingly, the interpolator circuit enables the input timing event signal to be delayed in finer increments, within the range of a data bit cell time, than is possible using the delay chain by itself.

ICs are typically assembled into packages that are physically and electrically coupled to a substrate, such as a PCB or a ceramic substrate, to form an "electronic assembly." The "electronic assembly" can be part of an "electronic system." An "electronic system" is broadly defined herein as any product comprising an "electronic assembly."

Figure 2:
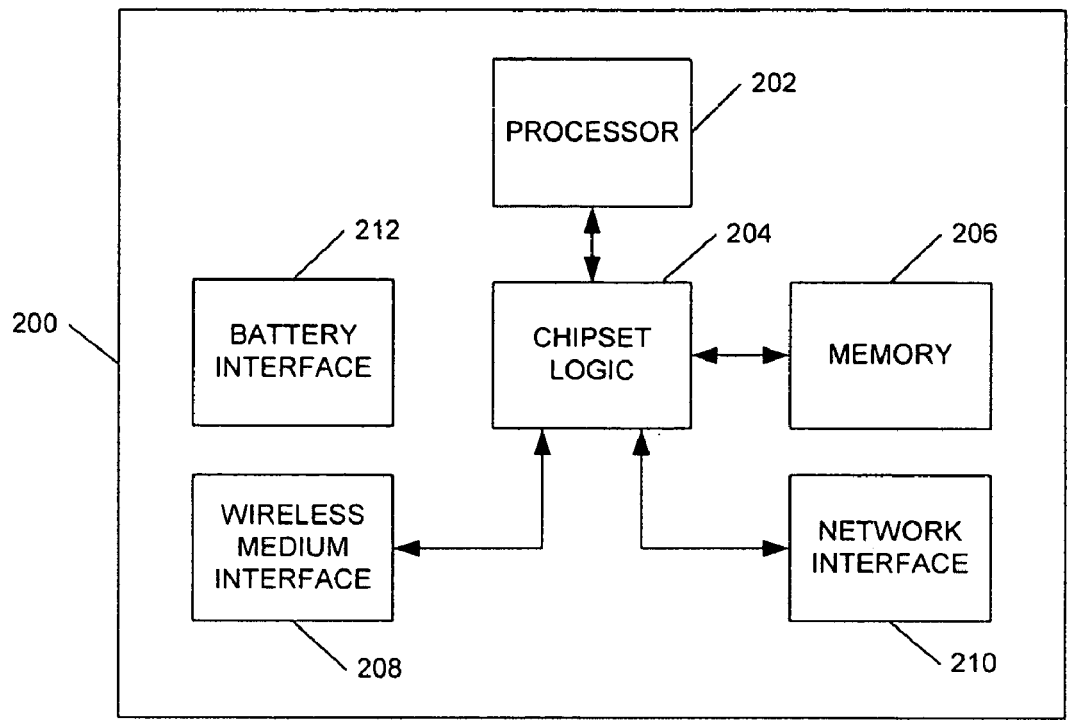
FIG. 2 illustrates a block diagram of an electronic system, in accordance with an embodiment of the invention.

FIG. 2 illustrates a block diagram of an electronic system 200, in accordance with an embodiment of the invention. In the example shown, system 200 includes one or more processors 202, chipset logic 204, memory 206, wireless medium interface 208, network interface 210, and battery interface 212. These components are coupled to one or more busses or other interconnections.

Processor 202 includes at least one computational circuit. As used herein, the term "processor" means any type of computational circuit, such as but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Chipset logic 204 can be any one or more supporting circuits, which couple processor 202 to internal or external devices. For example, chipset logic 204 can include input/output (I/O) circuits, bus circuits, debug circuits, node control circuits, port switching circuits, memory controller circuits, and so forth.

Memory 206 can include main memory, in the form of random access memory (RAM), one or more hard drives, and removable storage media, such as diskettes, compact disks (CDs), digital video disks (DVDs), and the like.

Wireless medium interface 208 provides communications capabilities with one or more external wireless systems. For example, but not by way of limitation, wireless medium interface 208 can provide an interface to a wireless local area network (WLAN), a cellular system, another type of radio frequency (RF) system, a system having optical links, or other types of systems. Wireless medium interface 208 includes the hardware, firmware, and/or software for implementing the corresponding wireless protocols, along with hardware (e.g., antennas, optical transmitters) that is capable of transmitting and/or receiving signals over the wireless medium. In other embodiments, system 200 does not include a wireless medium interface 208.

Network interface 210 provides communications capabilities with one or more networks. For example, but not by way of limitation, network interface 210 can provide an interface to a local area network (LAN), a wide area network (WAN), the Internet, or other types of systems. Network interface 210 includes the hardware, firmware, and/or software for implementing the corresponding network protocols, along with hardware (e.g., ports, connectors) that is capable of transmitting and/or receiving signals over the network. In other embodiments, system 200 does not include a network interface 210.

Battery interface 212 is capable of receiving one or more batteries, which can provide power to the various electronic components of system 200. In portable devices, the batteries can provide the primary source of power. In other devices, the batteries can provide a secondary source of power. In other embodiments, system does not include a battery interface 212.

Any or all of the major elements depicted in the electronic system 200 of FIG. 2 can comprise ICs, in addition to other circuits. Any one or more of these ICs or other circuits can include at least one variable-delay signal generator circuit, in accordance with embodiments of the invention.

Figure 3:
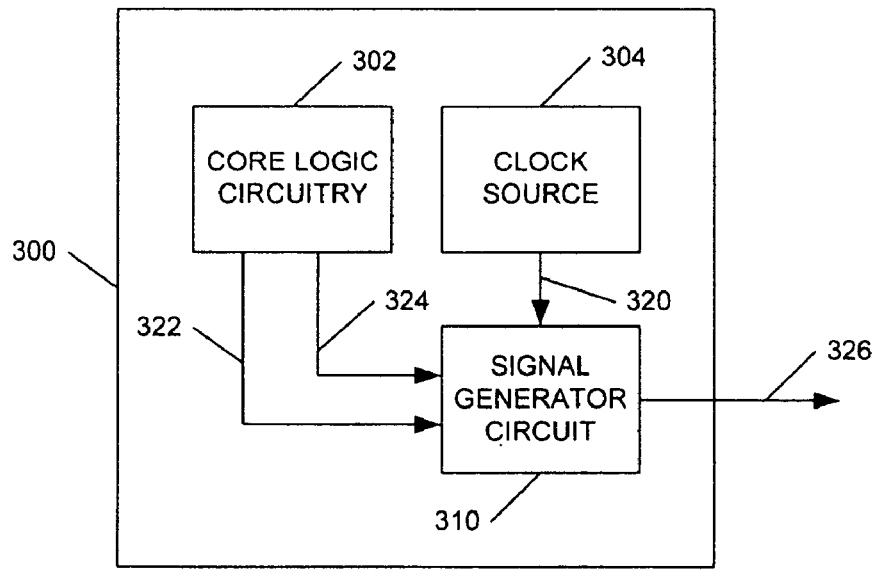
FIG. 3 illustrates a block diagram of an integrated circuit, in accordance with an embodiment of the invention.

FIG. 3 illustrates a block diagram of an IC 300, in accordance with an embodiment of the invention. IC 300 includes core logic circuitry 302, clock source 304, one or more variable-delay signal generator circuits 310, and possibly other circuitry (not shown). In one embodiment, IC 300 includes only one variable-delay signal generator circuit 310, which enables IC 300 to produce one output signal 326, referred to below as a delayed event signal. In another embodiment, IC 300 includes multiple variable-delay signal generator circuits 310, which enable IC 300 to produce multiple, parallel output signals 326.

Variable-delay signal generator circuit 310 receives an input clock signal 320 from clock source 304. In one embodiment, the input clock signal 320 is a periodic signal. From core logic circuitry 302, variable-delay signal generator circuit 310 also receives one or more input event signals 322 and delay value signals 324. Each input event signal 322 includes one or more pulses, with the pulse frequency having a maximum frequency, $F_{MAX}$, which can approach a frequency approximately equal to the input clock frequency. In one embodiment, input event signal 322 is a random signal, such as a data signal, which can include from one to multiple pulses. In another embodiment, input event signal 322 is a periodic or other non-random signal.

Based on the input event signals 322 and the delay value signals 324, variable-delay signal generator circuit 310 creates delayed event signals 326, which can be used for various operational and/or testing purposes. Delayed event signals 326 can be used to test FLBs that are internal or external to IC 300.

In one embodiment, the range of delays possible between a given input event signal pulse and a corresponding delayed event signal pulse is approximately equal to one full data bit cell time. For example, but not by way of limitation, if the maximum frequency, $F_{MAX}$, of an input event signal is approximately 400 megahertz (Mhz), then a full data bit cell time equals approximately 1/400 Mhz, or approximately 2.5 nanoseconds (nsec). Accordingly, variable-delay signal generator circuit 310 is capable of delaying an input event signal by a delay value within a range of approximately 0 to 2.5 nsec. In other embodiments, circuit 310 is capable of delaying an input event signal by a delay value within a smaller or larger range.

In one embodiment, which will be described in more detail later, variable-delay signal generator circuit 310 utilizes a delay chain and an interpolator circuit in order to produce a delayed event signal. The delay chain receives an input signal (e.g., an internal event signal), and it produces multiple delayed signals that represent delayed versions of the input signal. Consecutive pairs of the multiple delayed signals are separated by a first phase increment. The interpolator circuit receives the multiple delayed signals, and it interpolates between consecutive ones of those signals to produce an interpolated version of the input signal. The interpolated version is delayed to one of multiple, intermediate phase delays, which are separated by a second phase increment that is smaller than the first phase increment.

Figure 4:
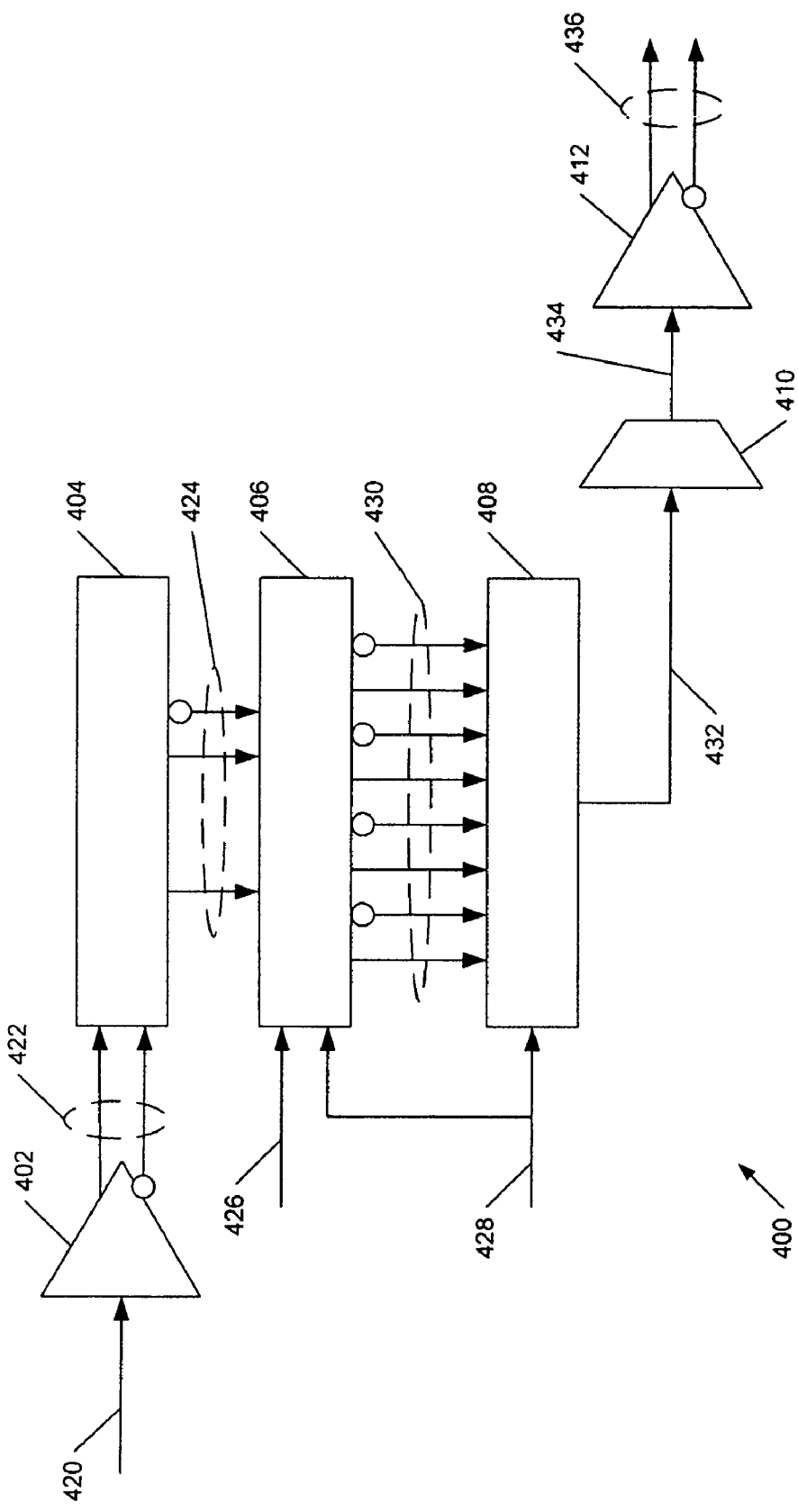
FIG. 4 illustrates a block diagram of a variable-delay signal generator, in accordance with an embodiment of the invention.

FIG. 4 illustrates a block diagram of a variable-delay signal generator circuit 400, in accordance with an embodiment of the invention. Variable-delay signal generator circuit 400 includes an input clock driver 402, a master delay cell 404, at least one slave delay chain 406, at least one interpolator circuit 408, a multiplexer 410, and an output signal driver 412, in one embodiment.

Input clock driver 402 receives an input clock signal 420, in one embodiment. Input clock signal 420 is a periodic signal. In an example embodiment, input clock signal 420 has a clock frequency approximately equal to 400 Mhz. In another example embodiment, input clock signal 420 has a clock frequency in a range of approximately 200–600 Mhz. In still other embodiments, the frequency of input clock signal 420 is greater or less than the above value or range.

Based on the input clock signal 420, input clock driver 402 provides a differential clock signal 422 to master delay cell 404. The differential clock signal 422 includes a positive clock signal and an inverted clock signal.

Using the input clock signal 422, master delay cell 404 locks itself to a fixed delay across process, voltage, and temperature (PVT) variations. In one embodiment, master delay cell 404 includes a phase detector, a loop filter, and one or more delay locked loop (DLL) cells that enable the master delay cell 404 to lock itself for a specific frequency across PVT.

Master delay cell 404 generates control signals 424. In one embodiment, control signals 424 include a pbias signal, an nbias signal, and a $V_{CTL}$ signal. The pbias and nbias signals control the delay produced by slave delay chain 406. The $V_{CTL}$ signal includes a bias voltage, which is provided to slave delay chain 406 and to interpolator circuit 408.

The control signals 424 produced by master delay cell 404 are received by one or more slave delay chains 406. Each slave delay chain 406 includes a delay line comprising a plurality of N "slave delay cells" (e.g., DLL cells), where N can be any desired number. Within a slave delay chain 406, each of the delay cells is calibrated by master delay cell 404. In other words, each of the delay cells uses the control signals 424 to maintain a fixed delay across PVT.

A first delay cell (not shown) of the delay chain 406 receives an input event signal 426, which can originate from the core logic of the IC (e.g., core logic circuitry 302, FIG. 3) or from another source. Input event signal 426 can be a periodic signal or a non-periodic signal. As described previously, each input event signal 426 includes one or more pulses, with the pulse frequency having a maximum value, $F_{MAX}$, that can approach a frequency approximately equal to the input clock frequency. In one embodiment, the input event signal 426 is a random signal (e.g., a data signal), which can include from one to multiple pulses.

The output of the first delay cell is applied to the input of the next delay cell in the delay line. The input and output of the first delay cell are also tapped, and they are used to produce the multiphase output signals 430. Likewise, the outputs of each successive delay cell in the delay line are fed into the succeeding delay cell, and they are also tapped as multiphase output signals 430.

In addition, slave delay chain 406 receives all or a portion of a delay value signal 428, which indicates the length of the delay that should be applied to the input event signal 426. In one embodiment, delay value signal 428 is in the form of a set of decoder bit settings. For example, 10 decoder bits could be used to represent a delay value. In other embodiments, more or fewer bits could be used.

The output of the slave delay chain 406 is a set of multi-phase signals 430. Each multi-phase signal 430 represents the input event signal, after it has been delayed by a phase value somewhere between 0° and 360°. The phase increment between each successive multi-phase signal is referred to herein as the "first phase increment." The first phase increment is calculated based on the number, N, of slave delay stages included within slave delay chain 406, and the maximum frequency, $F_{MAX}$, of the input event signal 426, as follows:

$$\text{First phase increment} = (1/F_{MAX})/N \qquad (1)$$

For example, but not by way of limitation, assume that the maximum frequency, $F_{MAX}$, of the input event signal 426 equals approximately 400 Mhz. This means that one data bit cell time equals approximately 1/400 Mhz or 2.5 nsec. Assuming that the slave delay chain 406 includes 12 stages, then 13 multi-phase signals would be produced, assuming that each stage is tapped before and after the stage. A phase difference between consecutive multi-phase signals 430 equals approximately $(1/F_{MAX})/N = 2.5$ nsec/12 = 208 picoseconds (psec). This value represents a first phase increment, which has a first granularity, where the granularity is defined as the phase difference between consecutive multi-phase signals 430.

In one embodiment, interpolator circuit 408 includes multiple interpolator blocks, which will be described in more detail in conjunction with FIGS. 5 and 6. Each multi-phase signal 430 is received by an interpolator block. Interpolator circuit 408 is controlled, based on delay value signal 428, to interpolate between consecutive phases of the multi-phase signals 430. This produces a signal that is delayable to a second granularity, which is finer (i.e., smaller) than the first granularity of the phase increment between consecutive multi-phase signals 430. In other words, interpolator circuit 430 enables an interpolator output signal 432 to be produced, which may have a modified delay value. The modified delay value coincides with one of multiple, intermediate phase delays between consecutive multi-phase signals 430. The distance between the intermediate phase delays represents a second phase increment, which is smaller than the first phase increment between consecutive multi-phase signals 430. Accordingly, the input signal 426 can be delayed to a finer granularity than is possible without the interpolator circuit 408.

The second phase increment is calculated based on the number, N, of slave delay stages included within slave delay chain 406, the maximum frequency, $F_{MAX}$, of the input event signal 426, and the number, M, of delay steps that can be produced between consecutive interpolator blocks, as follows:

$$\text{Second phase increment} = (1/F_{MAX})/(N*M) \quad (2)$$

For example, assume that $F_{MAX}$=400 Mhz, and the number of delay chain stages=12. If interpolator circuit 408 is capable of producing 10 delay steps between consecutive interpolator blocks, then interpolator circuit 408 can provide an interpolator output signal 432 that can be delayed in steps of 208 psec/10, which equals approximately 20 psec. This value represents the second phase increment.

In one embodiment, the second phase increment is approximately 20 psec, plus or minus 1 psec. In another embodiment, the second phase increment is in a range of approximately 10–30 psec. In still other embodiments, the second phase increment is greater or less than the above value or range. The above examples are for purposes of illustration and not of limitation. In other embodiments, more or fewer slave delay stages and/or interpolator delay steps could be included, and/or the input clock signal frequency could be faster or slower.

In the illustrated embodiment, circuit 400 includes only one slave delay chain 406 and one interpolator circuit 408, which will produce one interpolator output signal 432. In other embodiments, multiple slave delay chains 406 and interpolator circuits 408 could be included, which would produce multiple interpolator output signals 432. In such embodiments, each slave delay chain 406 can receive a different input event signal (e.g., signal 426), and each corresponding interpolator circuit (e.g., circuit 408) can produce an interpolator output signal (e.g., signal 432) anywhere within a data bit cell width (e.g., between 0 and 2.5 nsec for a 400 Mhz max. input event signal).

If the system includes multiple interpolator circuits 408, each circuit 408 may provide an interpolator output signal (e.g., signal 432) to multiplexer 410. Based on a control signal (not shown), multiplexer 410 selects one of the interpolator output signals to provide as a selected, interpolator output signal 434 to I/O buffer 412. I/O buffer 412, in turn, converts the selected interpolator output signal 434 into a multi-phase, delayed event signal 436, and drives the signal 436 out. The multi-phase, delayed event signal 436 is delayable to a delay value between 0 and one data bit cell width (e.g., 2.5 nsec), at phase increments having a relatively fine resolution (e.g., 20 psec).

Figure 5:
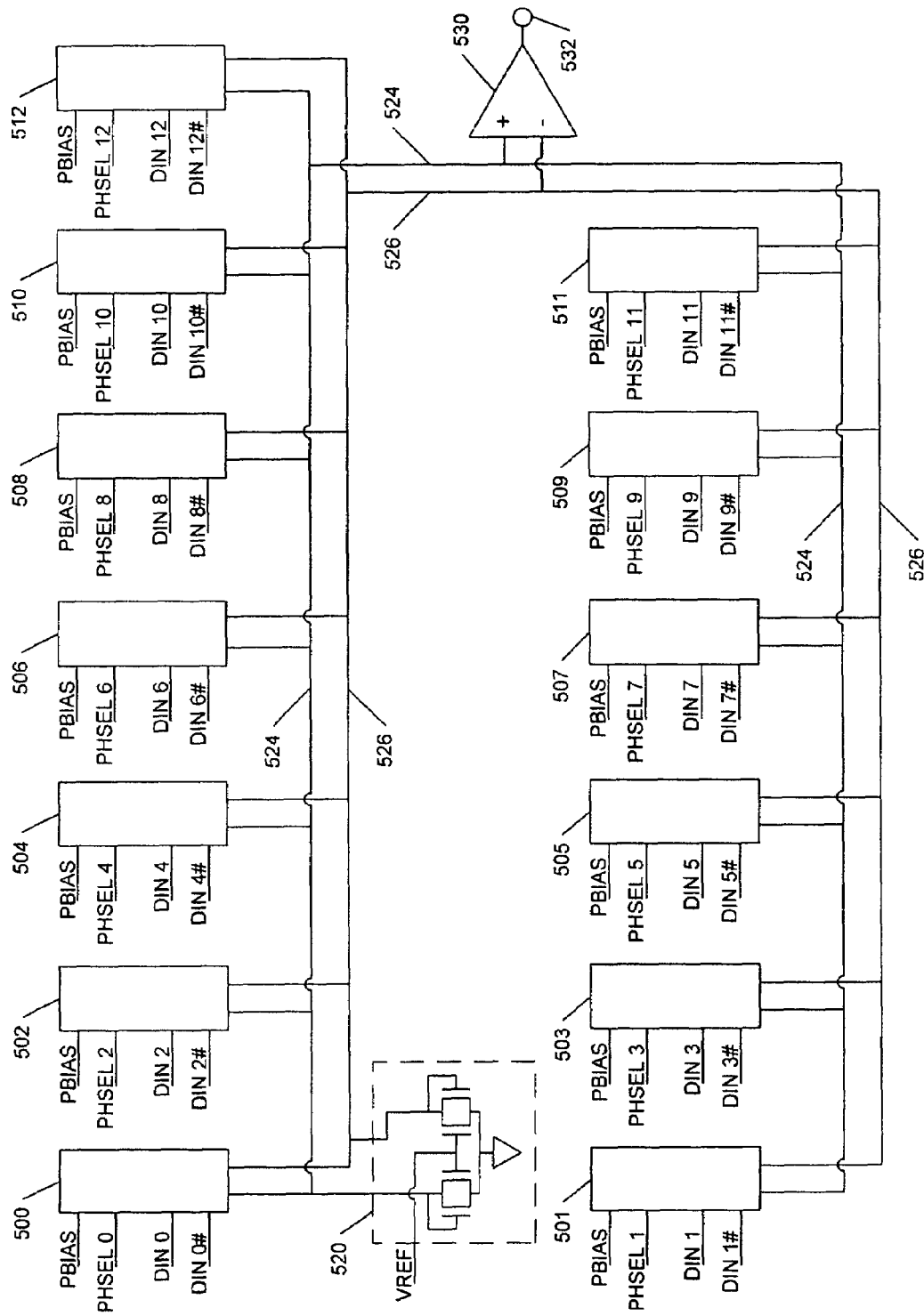
FIG. 5 illustrates a block diagram of an interpolator circuit, in accordance with an embodiment of the invention.

FIG. 5 illustrates a block diagram of an interpolator circuit, in accordance with an embodiment of the invention. The interpolator circuit includes multiple interpolator blocks 500–512, a bias circuit 520, and a differential amplifier 530. Interpolator blocks 500–512 are tied together and to differential amplifier 530 via differential output lines 524, 526.

In one embodiment, the interpolator circuit includes N+1 interpolator blocks 500–512, where N is the number of delay chain stages within the slave delay chain (e.g., chain 406, FIG. 4). In the illustrated example, interpolator circuit includes 13 interpolator blocks 500–512. Accordingly, the number of delay chain stages, N, equals 12.

Each interpolator block 500–512 receives one of N+1 multi-phase signals from the slave delay chain. A first multiphase signal is represented, for example, as "DIN 0" and its inverted version, "DIN 0#." These signals are provided as inputs to interpolator block 500.

As was described in detail above, consecutive multi-phase event signals (e.g., signals 430, FIG. 4) are separated by a first phase increment. The interpolator circuit provides a controllable phase offset in second, smaller phase increments. More particularly, the interpolator circuit interpolates between consecutive multi-phase signals. The number, M, of intermediate phase delays depends on the configuration of each interpolator block 500–512. In one embodiment, the number of intermediate phase delays (inclusive) equals approximately 10. In other embodiments, the number of intermediate phase delays can be larger or smaller.

The consecutive, multi-phase signals that the interpolator circuit will interpolate between are determined based on all or a portion of a delay value signal (e.g., signal 428, FIG. 4). The delay value signal includes a set of phase select bits, in one embodiment. Generally, only two consecutive phase select bits are set within the delay value signal at any particular time, and these bits indicate the two consecutive, multi-phase signals that the circuit should interpolate between. This also indicates which two consecutive interpolator blocks (e.g., blocks 500 and 501) will be used to perform the interpolation.

For example, a first phase select bit is represented as "PHSEL 0", which is input into block 500, and a second phase select signal is represented as "PHSEL 1", which is input into block 501. If both the PHSEL 0 and PHSEL 1 bits are set, then interpolator blocks 500 and 501 are activated, and the circuit will interpolate between the first and second multi-phase signals (e.g., DIN 0/DIN 0# and DIN 1/DIN 1#). Alternatively, consecutive combinations of other delay value signal bits can be set (e.g., PHSEL 1 and PHSEL 2, or PHSEL 2 and PHSEL 3, or PHSEL 3 and PHSEL 4, etc,), which indicates that the circuit will interpolate between other consecutive, multi-phase signals.

Besides the phase select signal (e.g., PHSEL 0) and the multi-phase signal (e.g., DIN 0 and DIN 0#), each interpolator block 500–512 also receives a current source select signal, PBIAS. As described previously, the current source select signal is used to control the current in an interpolator block. In one embodiment, the current source select signal is a direct current (DC) signal. As will be described in more detail in conjunction with FIGS. 7 and 8, the current source select signal is produced by a current source select signal generator circuit (not illustrated in FIG. 5).

Bias circuit 520 is used to provide a reference voltage on the differential output lines 524, 526. In one embodiment, the input voltage, VREF, to bias circuit 520 is the nbias signal (e.g., one of signals 424, FIG. 4) generated by master delay cell 404 (FIG. 4). Basically, VREF controls the load of the differential signal 524, 526 provided to differential amplifier 530. Differential amplifier 530 senses the difference between differential output lines 524, 526, and it drives out an interpolator output signal 532.

Figure 6:
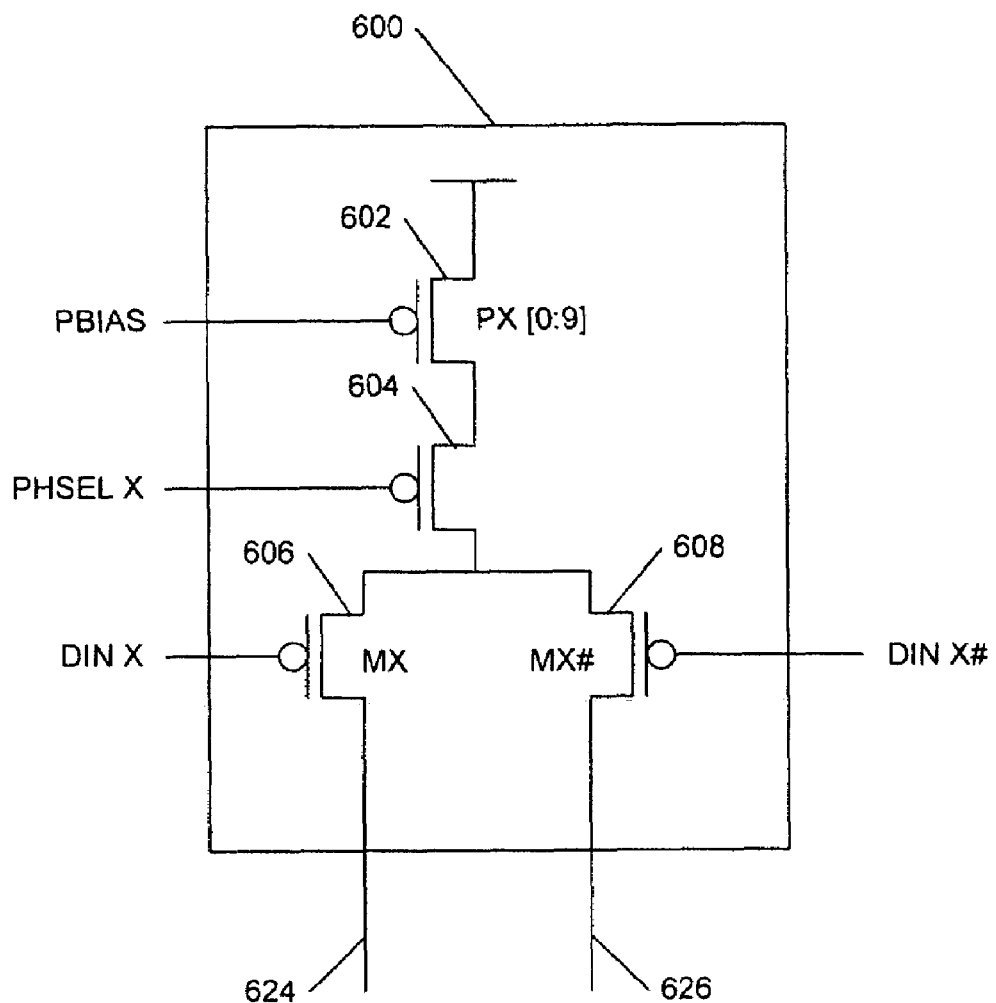
FIG. 6 illustrates a transistor-level schematic of an interpolator block of an interpolator circuit, in accordance with an embodiment of the invention.

FIG. 6 illustrates a transistor-level schematic of an interpolator block 600 of an interpolator circuit (e.g., FIG. 5), in accordance with an embodiment of the invention. Interpolator block 600 receives PBIAS, PHSEL X, DIN X, and DIN X# as input signals. Each of these signals is described in detail above.

Interpolator block 600 includes a current source 602, a phase select transmission gate 604, and multi-phase signal transmission gates 606, 608, in one embodiment. When the phase select transmission gate 604 is closed (i.e., when PHSEL X is active), a variable current is provided by current source 602 through one of gates 606, 608, depending on which gate is closed at the time (i.e., depending on the phases of DIN X and DIN X#). The variable current signals are output from the interpolator block 600 on differential output lines 624, 626.

Current source 602 includes an array of transistors (e.g., PMOS transistors), in one embodiment. The transistors within the array 602 are digitally turned on and off using the current source select signal, PBIAS, in one embodiment. In the illustrated example, array 602 includes transistors PX [0:9], which includes 10 transistor "legs." In other embodiments, more or fewer legs can be included in the array 602.

In one embodiment, any number of the transistors within array 602 can be turned on or off at a given time. For example, anywhere from 0 to all 10 legs can be on at a given time. The number of legs that are turned on at any given time depends on the value of the current source select signal, PBIAS. Accordingly, the current provided by array 602 depends on the number of legs that are turned on.

In order to interpolate to intermediate phase delays between two consecutive multi-phase signals, two consecutive interpolator blocks are selected, using the corresponding PHSEL signals. For example, referring again to FIG. 5, block 500 can be selected by providing a high value for PHSEL 0, and block 501 can be selected by providing a high value for PHSEL 1.

When blocks 500 and 501 are selected, it is possible to control the current produced by the current sources within each block 500, 501 by varying the current source select signals, PBIAS, provided to each block. In one embodiment, 10 current source transistors (referred to as "first legs") are available in block 500, and 10 current source transistors (referred to as "second legs") are available in block 501. When the current source select signals cause all 10 first legs to be turned on in block 500, and none of the second legs to be turned on in block 501, a least delayed output signal is produced. In other words, the interpolator output signal 532 (FIG. 5) is delayed by a value equal to 0 psec.

If the current source select signals are varied so that 9 first legs are turned on in block 500, and 1 second leg is turned on In block 501, the current through block 500 is decreased by one step, and the current through block 501 is increased by one step. The result is that the interpolator output signal 532 is delayed by approximately one interpolator phase increment. In other words, the interpolator output signal delay is increased by one interpolator phase increment (i.e., from the first interpolator phase increment, or 0 psec, to the second interpolator phase increment.

The current source select signals can be further varied to activate the following combinations of first and second legs, with each combination corresponding to a delay step: 8 first legs and 2 second legs, or 7 first legs and 3 second legs, or 6 first legs and 4 second legs, or 5 first legs and 5 second legs, or 4 first legs and 6 second legs, or 3 first legs and 7 second legs, or 2 first legs and 8 second legs, or 1 first leg and 9 second legs, or 0 first legs and 10 second legs. In this latter case, for the above example, the output signal will be delayed to a delay value that coincides with the second multi-phase signal delay.

For the embodiment described above, 10 intermediate phase delays or delay steps exist between consecutive multi-phase signals. The terms "intermediate phase delays" and "intermediate delay steps" are meant to include phase delays that coincide with the phase delays of a multi-phase signal. For example, if a phase delay corresponding to a first multi-phase signal is 0 psec, then a first intermediate phase delay also can have a value of 0 psec. Similarly, if a phase delay corresponding to a second multi-phase signal is 208 psec, then a last intermediate phase delay can have a value of 208 psec. In other embodiments, the intermediate phase delays exclude one or both phase delays that coincide with consecutive multi-phase signals.

In one embodiment, the number of intermediate delay steps equals the number of transistor legs within a variable current source (e.g., current source 602, FIG. 6). In another embodiment, the number of intermediate delay steps equals the number of possible combinations of activated legs between consecutive interpolator blocks. In other embodiments, more or fewer delay steps can be provided between consecutive interpolator blocks, and/or there may not be a 1:1 correlation between the number of intermediate delay steps and the number of legs within the current source.

By varying the current source select signals, PBIAS, between consecutive interpolator blocks, the phase delay applied to the signal is varied between the phase delays of the consecutive multi-phase signals going into those consecutive interpolator blocks. The signal can be delayed by greater values by selecting later consecutive interpolator blocks. For example, if selection of blocks 500 and 501 (FIG. 5) enable a signal to be delayed between 0 psec and approximately 208 psec, then selection of blocks 501 and 502 (FIG. 5) enable a signal to be delayed between approximately 208 psec and 416 psec. Similarly, selection of blocks 502 and 503 (FIG. 5) enable a signal to be delayed between approximately 416 psec and 624 psec, and so on.

Figure 7:
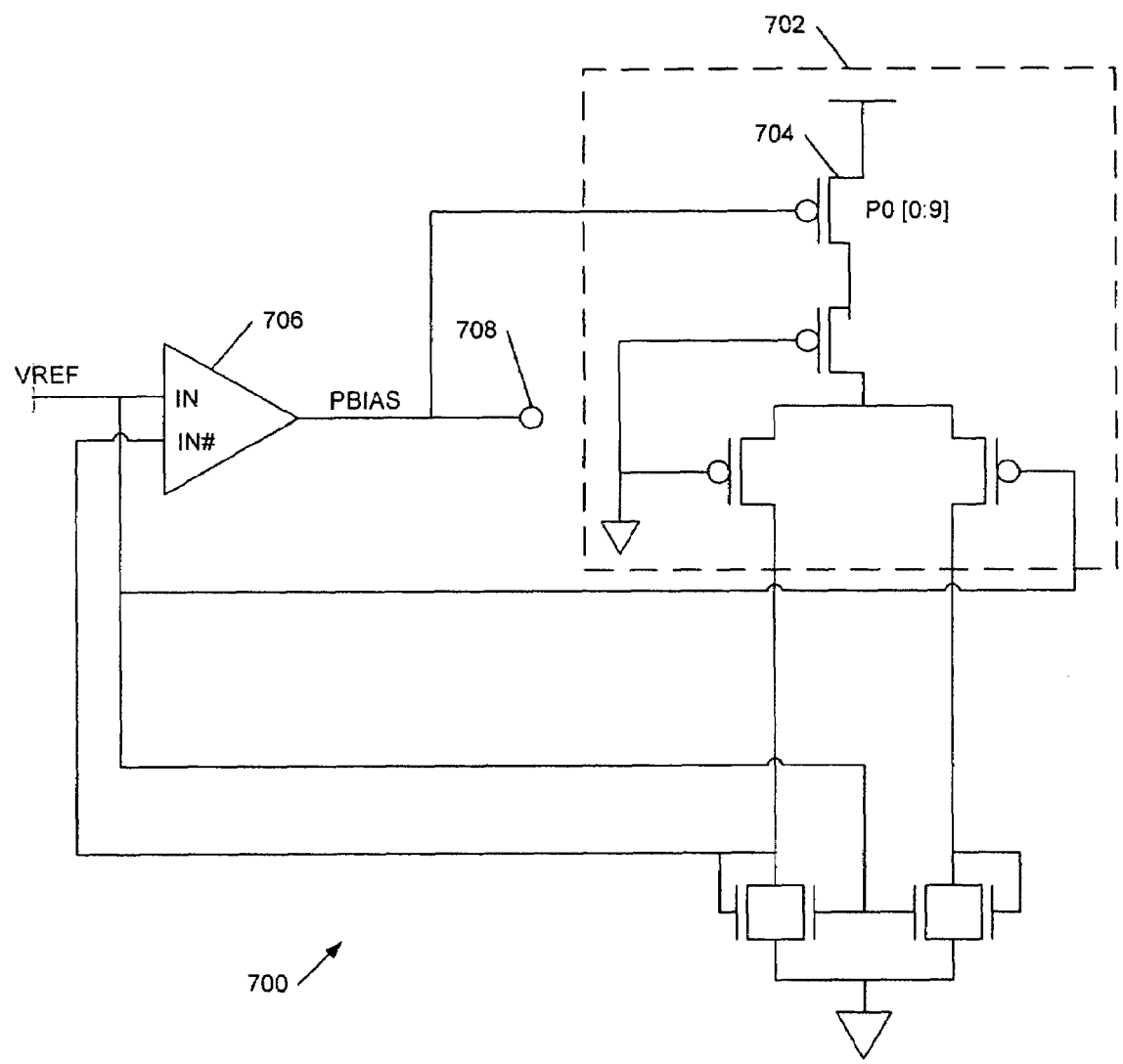
FIG. 7 illustrates a transistor-level schematic of a current source select signal generator circuit, in accordance with an embodiment of the invention.

The current source select signal, PBIAS, is generated from a current source select signal generator circuit. FIG. 7 illustrates a transistor-level schematic of a current source select signal generator circuit 700, in accordance with an embodiment of the invention. In one embodiment, circuit 700 attempts to maintain a constant output voltage level on the interpolator.

Circuit 700 includes a substantial replica 702 of the circuitry within an interpolator block (e.g., block 600, FIG. 6). In particular, circuit 700 includes a current source 704, with a number of legs that matches the number of legs within an interpolator block. In addition, circuit 700 includes a comparator 706, which generates the current source select signal, PBIAS, 708 based on a reference voltage, VREF, and outputs from the interpolator block replica circuit 702.

In the illustrated embodiment, all legs of the current source 704 are tied to the PBIAS signal 708. However, in the interpolator block 600 illustrated in FIG. 6, any number of legs (e.g., from 0 to 10 legs) are turned on for one phase, and the rest are turned on for the other phase. Accordingly, in the worst case, a mismatch between the number of activated current source signal generator circuit legs (e.g., 10 legs) and the number of activated interpolator block legs can be as great as 10 legs (i.e., when 0 legs of the interpolator block are activated). This may cause the interpolator output to fluctuate with different interpolations, which may in turn cause a loss of linearity.

Figure 8:
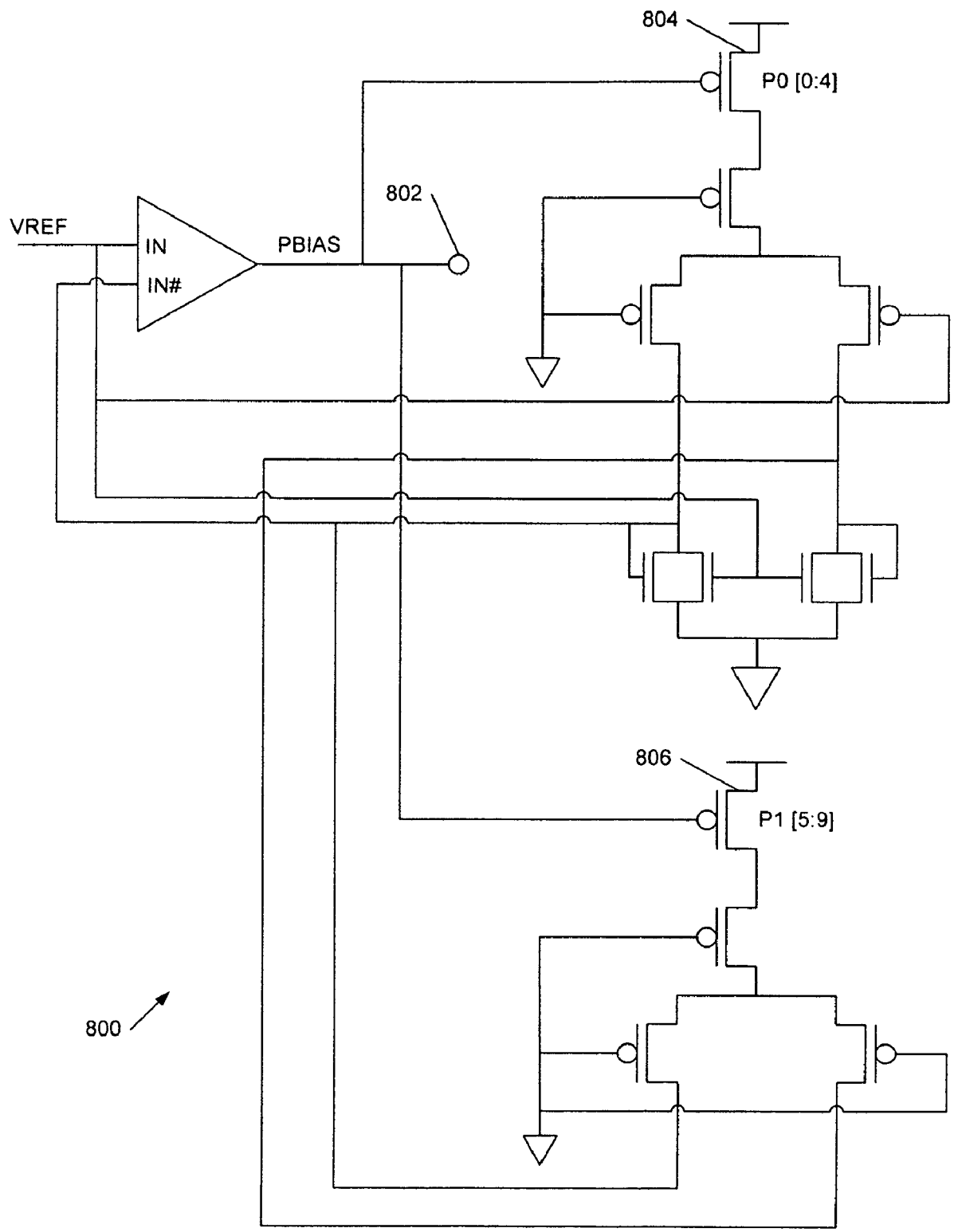
FIG. 8 illustrates a transistor-level schematic of a current source select signal generator circuit, in accordance with another embodiment of the invention.

To improve linearity, a modified current source signal generator circuit is provided, in one embodiment. FIG. 8 illustrates a transistor-level schematic of a current source select signal generator circuit 800, in accordance with another embodiment of the invention.

A distinction between circuit 700 of FIG. 7 and circuit 800 of FIG. 8 is that, in circuit 800, the PBIAS signal 802 drives a split current source, which includes two current sources 804, 806, rather than one current source. Both the first current source 804 and the second current source 806 include a fraction of the number of legs that are included in an interpolator block's current source. In one embodiment, the fraction equals ½ for both current sources 804, 806. In other embodiments, each current source 804, 806 can include more or less than ½ the number of interpolator legs. According to the examples given previously, if an interpolator block's current source (e.g., source 602, FIG. 6) includes 10 legs, the first current source 804 can include 5 legs (e.g., legs 0:4), and the second current source 806 can also include 5 legs (e.g., legs 5:9).

Using the configuration illustrated in FIG. 8, the first and second current sources 804, 806 are used, in parallel, to generate the PBIAS signal 802. This places the PBIAS signal closer to the center of its range, which reduces by half the potential mismatch between the current source select signal, PBIAS, and the current through the interpolator current source. Accordingly, the overall linearity of the interpolator can be improved using the current source select signal generator circuit of FIG. 8.

Figure 9:
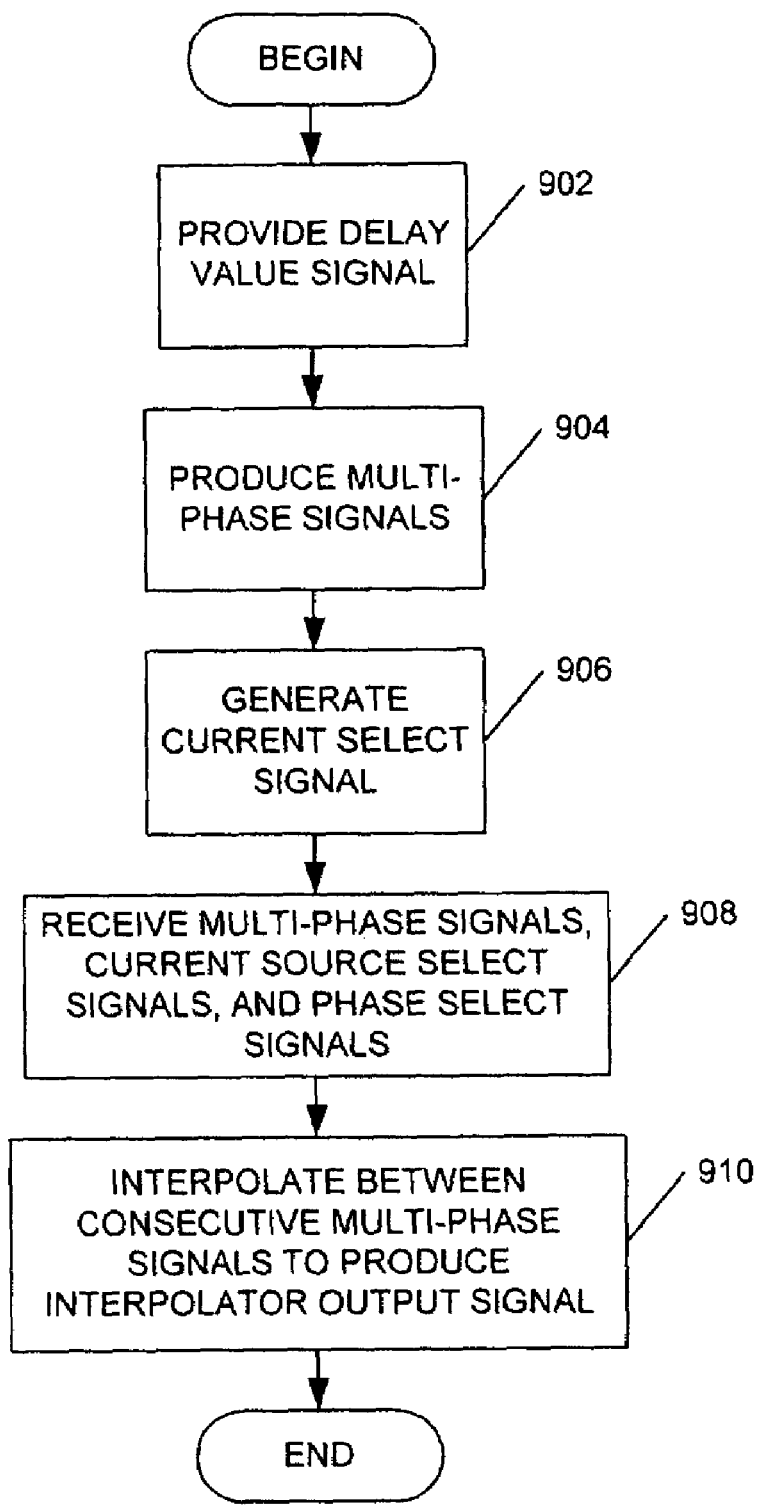
FIG. 9 illustrates a flowchart of a method of generating a signal that is subject to a variable timing delay, in accordance with an embodiment of the invention.

FIG. 9 illustrates a flowchart of a method of generating a signal that is subject to a variable timing delay, in accordance with an embodiment of the invention. The method begins, in block 902, by providing a delay value signal, which indicates a delay that an interpolator circuit will impart to an input signal.

In block 904, a delay chain (e.g., chain 406, FIG. 4) produces multiple, multi-phase signals (e.g., signals 430, FIG. 4), each of which represents a coarsely-delayed version of the input event signal. The multiple, multi-phase signals include signals that are delayed by values between 0 nsec and one bit cell width (e.g., between 0 and 2.5 nsec). In one embodiment, each of the multi-phase signals is separated by a first phase increment.

In block 906, the current source select signal is generated for the interpolator blocks. In one embodiment, generation of the current source select signal is achieved using a signal generator circuit that includes two current sources (e.g., sources 804, 806, FIG. 8). Each of the current sources includes a fraction (e.g.,½) of the number of legs as does a current source (e.g., source 602, FIG. 6) within an interpolator block (e.g., block 600, FIG. 6).

In block 908, the multi-phase signals (e.g., "DIN X" and "DIN X#", FIG. 6) are received by an interpolator circuit, which includes multiple, consecutive interpolator blocks (e.g., blocks 500–512, FIG. 5). Each of the interpolator blocks also receives a current source select signal (e.g., "PBIAS", FIG. 6) and a phase select signal (e.g., "PHSEL N", FIG. 6).

In block 910, the interpolator circuit interpolates between consecutive multi-phase signals. The consecutive multi-phase signals are received by consecutive interpolator blocks. Each of the interpolator blocks is capable of producing a variable current, which has a value that depends on the value of the current source select signal input into the interpolator block. Interpolation between multi-phase signals is performed by varying a first current produced by a first interpolator block, and a second current produce by a second, consecutive interpolator block. The combination of the first current and the second current results in an interpolator output signal that is delayed to one of multiple intermediate phase delay values.

In order to produce the first current, a first number of transistor legs of a first current source of the first block are turned on. In order to produce the second current, a second number of transistor legs of a second current source of the second block are turned on. In either case, anywhere from zero to the maximum number of legs can be turned on in either interpolator block.

The combination of the first and second currents results in an interpolator output signal. In one embodiment, the interpolator output signal is delayable to one of multiple second phase increments, which are separated by smaller phase differences than the first phase increment between consecutive multi-phase signals. The method then ends.

Thus, high-resolution, variable-delay signal generator circuits and methods of their use have been described in accordance with various embodiments. The inventive subject matter can be implemented in a number of different embodiments, including a variable-delay signal generator circuit, an interpolator circuit, an integrated circuit, an electronic assembly, an electronic system, a method of providing variable phase delays, and a method of performing IC testing, among other things. Other embodiments will be readily apparent to those of ordinary skill in the art.

The inventive subject matter is not to be construed as limited to any particular architecture or combination of functional elements or ICs. Its use is extremely flexible, being readily adaptable to any electronic system in which its advantages are desired to be achieved. The systems depicted in FIGS. 1 and 2 are merely two examples of electronic systems in which the inventive subject matter can be used.

Many variations of the various circuits appearing in the drawings will be apparent to those skilled in the art having the benefit of this disclosure. For example, the various circuits disclosed herein may be replaced with other circuits of different construction and of different quantity that, taken as a whole, perform the same or similar function. The general functions of the inventive subject matter may also be performed by significantly different circuitry. In addition, where a single conductor is illustrated or described, it may be replaced by parallel conductors. Where parallel conductors are illustrated or described, they may be replaced by a single conductor.

It is not required that interpolator blocks (e.g., blocks 500–512, FIG. 5) be identical to one another. Further, although certain numbers of slave delay chains (e.g., chains 406, FIG. 4), multi-phase signals (e.g., signals 430, FIG. 4), interpolator circuits (e.g., circuits 408, FIG. 4), interpolator blocks (e.g., blocks 500–512, FIG. 5), interpolator current source legs (e.g., legs 602, FIG. 6), current source select signal circuit legs (e.g., legs 704, FIG. 7, and 804, 806, FIG. 8), and other circuit elements and signals have been illustrated and described, it would be obvious to those of skill in the art, based on the description herein, that more and/or fewer of these various elements and signals could be included in other embodiments.

The various structures of the inventive subject matter may be implemented according to any of various elements and methods known to those skilled in the art. There may be intermediate structure (e.g., multiplexers, inverters, buffers, etc.) or signals that are between two illustrated structures. Some conductors may not be continuous as illustrated, but rather they may be broken up by intermediate structure. The borders of boxes in the figures are for illustrative purposes only. An actual device would not have to include such defined boundaries. Further, the relative sizes and/or layouts of the illustrated elements are not to suggest actual relative sizes and/or layouts.

The foregoing description of specific embodiments reveals the general nature of the inventive subject matter sufficiently that others can, by applying current knowledge, readily modify and/or adapt it for various applications without departing from the generic concept. Therefore such adaptations and modifications are within the meaning and range of equivalents of the disclosed embodiments. The phraseology or terminology employed herein is for the purpose of description and not of limitation. Therefore, it is manifestly intended that the inventive subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:

1. A circuit comprising:
a delay chain, which is capable of receiving an input signal and producing multiple delayed signals that represent delayed versions of the input signal, wherein the multiple delayed signals are separated by a first phase increment;
multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment; and
a current source select signal generator circuit, operably coupled to the multiple interpolator blocks, which includes a split current source, and which is capable of providing variable current source select signals to the multiple interpolator blocks to control interpolation between the consecutive ones of the multiple delayed signals; and
a differential comparator, operably coupled to the multiple interpolator blocks, which is capable of producing, as an output, the interpolated version of the input signal based on signals received from the multiple interpolator blocks.

2. A circuit comprising:
a delay chain, which is capable of receiving an input signal and producing multiple delayed signals that represent delayed versions of the input signal, wherein the multiple delayed signals are separated by a first phase increment;
multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment, and wherein each of the multiple interpolator blocks includes an interpolator block current source having a first number of transistor legs, which are selectively activatable based on a value of an input bias signal to the current source; and
a current source select signal generator circuit, operably coupled to the multiple interpolator blocks, which includes a split current source, and which is capable of providing variable current source select signals to the multiple interpolator blocks to control interpolation between the consecutive ones of the multiple delayed signals, wherein the split current source of the current source select signal generator circuit includes
a first current source having a second number of transistor legs that is a first fraction of the first number, and
a second current source having a third number of transistor legs that is a second fraction of the first number.

3. The circuit of claim 2, wherein the first fraction and the second fraction are ½.

4. A circuit comprising:
a delay chain, which is capable of receiving an input signal and producing multiple delayed signals that represent delayed versions of the input signal, wherein the multiple delayed signals are separated by a first phase increment;
multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment; and
a current source select signal generator circuit, operably coupled to the multiple interpolator blocks, which includes a split current source, and which is capable of providing variable current source select signals to the multiple interpolator blocks to control interpolation between the consecutive ones of the multiple delayed signals.

5. The circuit of claim 4, wherein the first phase increment is approximately equal to:

$$(1/F_{MAX})/N,$$

wherein $F_{MAX}$ equals a maximum frequency of the input signal, and N equals a number of delay chain stages.

6. The circuit of claim 4, wherein the second phase increment is approximately equal to:

$(1/F_{MAX})/(N*M)$, wherein $F_{MAX}$ equals a maximum frequency of the input signal, N equals a number of delay chain stages, and M equals a number of intermediate phase delays.

7. A circuit comprising:
multiple interpolator blocks, wherein consecutive ones of the multiple interpolator blocks are used to interpolate between a first multi-phase signal and a second multi-phase signal that are separated by a first phase increment, and wherein each interpolator block includes
an interpolator block current source having a first number of transistor legs, wherein a number of activated legs, at any given time, is based on a variable current source select signal, and
multiple input signal gates, which are activatable in response to a multi-phase signal; and
a current source select signal generator circuit, operably coupled to the multiple interpolator blocks, and which is capable of providing variable current source select signals to the consecutive ones of the multiple interpolator blocks, and wherein the current source select signal generator circuit includes a split current source.

8. The circuit of claim 7, wherein the split current source of the current source select signal generator circuit comprises:
a first current source having a second number of transistor legs that equals a first fraction of the first number; and
a second current source having a third number of transistor legs that equals a second fraction of the first number.

9. The circuit of claim 7, wherein the first phase increment is approximately equal to:

$(1/F_{MAX})/N$, wherein $F_{MAX}$ equals a maximum frequency of the input signal, and N equals a number of delay chain stages.

10. The circuit of claim 7, wherein the first multi-phase signal and the second multi-phase signal represent delayed versions of an input signal, and wherein the circuit produces an interpolated version of the input signal, and wherein the interpolated version is delayed to one of multiple, intermediate delay values that are separated by a second phase increment that is smaller than the first phase increment.

11. The circuit of claim 10, wherein the second phase increment is approximately equal to:

$(1/F_{MAX})/(N*M)$, wherein $F_{MAX}$ equals a maximum frequency of the input signal, N equals a number of delay chain stages, and M equals the first number of transistor legs.

12. An integrated circuit comprising:
a delay chain, which is capable of receiving an input signal and producing multiple delayed signals that represent delayed versions of the input signal, wherein the multiple delayed signals are separated by a first phase increment;
multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment, wherein each of the multiple interpolator blocks includes an interpolator block current source having a first number of transistor legs, which are selectively activatable based on a value of an input bias signal to the current source; and
a current source select signal generator circuit, operably coupled to the multiple interpolator blocks, which includes a split current source, and which is capable of providing variable current source select signals to the multiple interpolator blocks to control interpolation between the consecutive ones of the multiple delayed signals, wherein the split current source of the current source select signal generator circuit includes
a first current source having a second number of transistor legs that is a first fraction of the first number, and
a second current source having a third number of transistor legs that is a second fraction of the first number.

13. An integrated circuit comprising:
a delay chain, which is capable of receiving an input signal and producing multiple delayed signals that represent delayed versions of the input signal, wherein the multiple delayed signals are separated by a first phase increment;
multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment; and
a current source select signal generator circuit, operably coupled to the multiple interpolator blocks, which includes a split current source, and which is capable of providing variable current source select signals to the multiple interpolator blocks to control interpolation between the consecutive ones of the multiple delayed signals.

14. The integrated circuit of claim 13, further comprising:
logic circuitry, which is capable of producing a delay value signal, wherein the delay value signal indicates which two blocks of the multiple interpolator blocks are to be used as the consecutive interpolator blocks from which the interpolated version of the input signal is produced.

15. A system comprising:
at least one integrated circuit, which includes a variable-delay signal generator circuit, wherein the variable-delay signal generator circuit includes
a delay chain, which is capable of receiving an input signal and producing multiple delayed signals that represent delayed versions of the input signal, wherein the multiple delayed signals are separated by a first phase increment;
multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment, wherein each of the multiple interpolator blocks includes an interpolator block current source having a first number of transistor legs, which are selectively activatable based on a value of an input bias signal to the current source; and a current source select signal generator circuit, operably coupled to the multiple interpolator blocks, which includes a split current source, and which is capable of providing variable current source select signals to the multiple interpolator blocks to control interpolation between the consecutive ones of the multiple delayed signals, wherein the split current source of the current source select signal generator circuit a first current source having a second number of transistor legs that is a first fraction of the first number, and a second current source having a third number of transistor legs that is a second fraction of the first number.

16. A system comprising:

at least one integrated circuit, which includes a variable-delay signal generator circuit, wherein the variable-delay signal generator circuit includes a delay chain, which is capable of receiving an input signal and producing multiple delayed signals that represent delayed versions of the input signal, wherein the multiple delayed signals are separated by a first phase increment;

multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment; and a current source select signal generator circuit, operably coupled to the multiple interpolator blocks, which includes a split current source, and which is capable of providing variable current source select signals to the multiple interpolator blocks to control interpolation between the consecutive ones of the multiple delayed signals.

17. The system of claim 16, further comprising:

a network interface to couple to one or more networks, wherein the network interface includes the at least one integrated circuit.

18. The system of claim 16, further comprising:

a wireless medium interface to couple to one or more external wireless systems, wherein the wireless medium interface includes the at least one integrated circuit.

19. A test assembly comprising:

an integrated circuit, which includes a variable-delay signal generator circuit that includes a delay chain, which is capable of receiving an input signal and producing multiple delayed signals that represent delayed versions of the input signal, wherein the multiple delayed signals are separated by a first phase increment;

multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment, wherein each of the multiple interpolator blocks includes an interpolator block current source having a first number of transistor legs, which are selectively activatable based on a value of an input bias signal to the current source; and a current source select signal generator circuit, operably coupled to the multiple interpolator blocks, which includes a split current source, and which is capable of providing variable current source select signals to the multiple interpolator blocks to control interpolation between the consecutive ones of the multiple delayed signals, wherein the split current source of the current source select signal generator circuit includes a first current source having a second number of transistor legs that is a first fraction of the first number, and a second current source having a third number of transistor legs that is a second fraction of the first number.

20. A test assembly comprising:

an integrated circuit, which includes a variable-delay signal generator circuit that includes a delay chain, which is capable of receiving an input signal and producing multiple delayed signals that represent delayed versions of the input signal, wherein the multiple delayed signals are separated by a first phase increment;

multiple interpolator blocks, operably coupled to the delay chain, wherein consecutive ones of the multiple interpolator blocks are capable of receiving and interpolating between consecutive ones of the multiple delayed signals to produce an interpolated version of the input signal, wherein the interpolated version is delayed to one of multiple, intermediate delay values that are separated by a second phase increment that is smaller than the first phase increment; and a current source select signal generator circuit, operably coupled to the multiple interpolator blocks, which includes a split current source, and which is capable of providing variable current source select signals to the multiple interpolator blocks to control interpolation between the consecutive ones of the multiple delayed signals.

21. The test assembly of claim 20, wherein the integrated circuit further comprises:

logic circuitry, which is capable of producing a delay value signal, wherein the delay value signal indicates which two blocks of the multiple interpolator blocks are to be used as the consecutive interpolator blocks from which the interpolated version of the input signal is produced.

22. A method comprising:

generating current source select signals using a split current source;

receiving, by two consecutive interpolator blocks, two consecutive multi-phase signals, wherein the two consecutive multi-phase signals are separated by a first phase increment; and interpolating between the two consecutive multi-phase signals by varying a first current produced by a first block of the consecutive interpolator blocks, and a second current produced by a second block of the consecutive interpolator blocks, wherein the first current and the second current have values that depend on the current source select signals, and wherein the combination of the first current and the second current results in an interpolator output signal that is delayed to one of multiple intermediate phase delay values, and wherein interpolating includes turning on a first number of transistor legs of a first current source of the first block, resulting in the first current, wherein the first number depends on a first current source select signal, and turning on a second number of transistor legs of a second current source of the second block, resulting in the second current, wherein the second number depends on a second current source select signal.

23. A method comprising:

generating current source select signals using a split current source;

receiving, by two consecutive interpolator blocks, two consecutive multi-phase signals, wherein the two consecutive multi-phase signals are separated by a first phase increment; and interpolating between the two consecutive multi-phase signals by varying a first current produced by a first block of the consecutive interpolator blocks, and a second current produced by a second block of the consecutive interpolator blocks, wherein the first current and the second current have values that depend on the current source select signals, and wherein the combination of the first current and the second current results in an interpolator output signal that is delayed to one of multiple intermediate phase delay values.

24. The method of claim 23, further comprising:

producing, by a delay chain, the two consecutive multi-phase signals.

25. A circuit comprising:

a delay chain to receive an input signal and to produce multiple delayed signals that represent delayed versions of the input signal, wherein the multiple delayed signals are separated by a first phase increment;

multiple interpolator blocks, operably coupled to the delay chain, wherein consecutive ones of the multiple interpolator blocks are to receive and to interpolate between consecutive ones of the multiple delayed signals to produce an interpolated version of the input signal, wherein the interpolated version is delayed to one of multiple, intermediate delay values that are separated by a second phase increment that is smaller than the first phase increment; and a signal generator circuit, operably coupled to the multiple interpolator blocks, to provide variable signals to the multiple interpolator blocks to control interpolation between the consecutive ones of the multiple delayed signals.

26. The circuit of claim 25, wherein each of the multiple interpolator blocks comprises an interpolator block current source having a first number of transistor legs, which are selectively activatable based on a value of an input bias signal to the current source.

27. The circuit of claim 26, wherein the signal generator circuit comprises:

a first current source having a second number of transistor legs that is a first fraction of the first number; and a second current source having a third number of transistor legs that is a second fraction of the first number.

* * * * *